(12) United States Patent
Kim et al.

(10) Patent No.: US 11,308,872 B2
(45) Date of Patent: Apr. 19, 2022

(54) OLED DISPLAY PANEL FOR MINIMIZING AREA OF INTERNALCONNECTION LINE PART FOR CONNECTING GIP DIRVING CIRCUIT LOCATED IN ACTIVE AREA AND OLED DISPLAY DEVICE COMPRISING THE SAME

(71) Applicant: LG Display Co., Ltd., Seoul (KR)

(72) Inventors: Kyung-Min Kim, Seoul (KR); In-Hyo Han, Seoul (KR); Hun-Ki Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/174,721

(22) Filed: Oct. 30, 2018

(65) Prior Publication Data

US 2019/0164478 A1    May 30, 2019

(30) Foreign Application Priority Data

Nov. 27, 2017    (KR) .......................... 10-2017-0159650

(51) Int. Cl.
*G09G 3/30*    (2006.01)
*G09G 3/3225*    (2016.01)
(Continued)

(52) U.S. Cl.
CPC ......... *G09G 3/3225* (2013.01); *G09G 3/3233* (2013.01); *G09G 3/3266* (2013.01);
(Continued)

(58) Field of Classification Search
CPC .. G09G 3/3225; G09G 3/3233; G09G 3/3266; G09G 2230/00; G09G 2300/0408;
(Continued)

(56) References Cited

U.S. PATENT DOCUMENTS

2012/0113016 A1* 5/2012 Lin ........................ G06F 3/0416
345/173
2013/0321499 A1* 12/2013 Park ..................... G09G 3/3275
345/698

(Continued)

FOREIGN PATENT DOCUMENTS

CN    102547331 A    7/2012
CN    104485085 A    4/2015
(Continued)

OTHER PUBLICATIONS

Office Action dated Feb. 4, 2020 issued in corresponding Taiwanese Application No. 107138408 (5 pages).

(Continued)

*Primary Examiner* — Adam J Snyder
(74) *Attorney, Agent, or Firm* — Polsinelli PC

(57) ABSTRACT

The present disclosure relates to an OLED display panel for minimizing the size of a bezel and includes: an active area including data lines, scan lines intersecting the data lines, and sub-pixels arranged at each intersection; and a stage of a GIP driving circuit distributed and arranged in a plurality of unit pixel regions driven by m (m being a natural number) scan lines in the active area, to supply scan pulses to the corresponding scan lines, wherein the active area further includes m GIP internal connection lines parts respectively adjacent to the m scan lines, and a plurality of internal connection lines for connecting elements constituting each stage is distributed and arranged in the m GIP internal connection line parts.

7 Claims, 8 Drawing Sheets

(51) Int. Cl.
  *H03K 3/027* (2006.01)
  *H01L 27/32* (2006.01)
  *G09G 3/3266* (2016.01)
  *G09G 3/3233* (2016.01)

(52) U.S. Cl.
  CPC ...... *H01L 27/3213* (2013.01); *H01L 27/3276* (2013.01); *H01L 27/3288* (2013.01); *H03K 3/027* (2013.01); *G09G 2230/00* (2013.01); *G09G 2300/0408* (2013.01); *G09G 2300/0452* (2013.01); *G09G 2300/0842* (2013.01); *G09G 2310/0251* (2013.01); *G09G 2310/0262* (2013.01)

(58) Field of Classification Search
  CPC ............. H01L 27/3213; H01L 27/3276; H01L 27/3288; H03K 3/027
  See application file for complete search history.

(56) References Cited

U.S. PATENT DOCUMENTS

| | | | | |
|---|---|---|---|---|
| 2015/0293546 A1* | 10/2015 | Tanaka | .............. | G02F 1/136213 327/541 |
| 2016/0189598 A1* | 6/2016 | Takeuchi | .............. | G09G 3/3677 345/210 |
| 2016/0247442 A1* | 8/2016 | Dai | .................. | G09G 3/3677 |
| 2016/0329021 A1* | 11/2016 | Nagayama | .............. | G09G 3/36 |
| 2016/0358551 A1* | 12/2016 | Nagayama | ........... | G09G 3/3258 |
| 2017/0025070 A1* | 1/2017 | Kang | .................. | G09G 3/3266 |
| 2017/0047030 A1* | 2/2017 | Kim | .................. | G11C 19/287 |
| 2017/0117341 A1* | 4/2017 | Chen | .................. | G09G 3/3291 |
| 2017/0154572 A1 | 6/2017 | Kim et al. | | |
| 2017/0193950 A1 | 7/2017 | Kim et al. | | |
| 2017/0287381 A1* | 10/2017 | Park | .................. | G09G 3/2092 |
| 2017/0287390 A1 | 10/2017 | Lee et al. | | |
| 2017/0345373 A1* | 11/2017 | Kang | .................. | G09G 3/3258 |
| 2017/0372664 A1* | 12/2017 | He | ......................... | G09G 3/20 |
| 2018/0068629 A1* | 3/2018 | Shin | .................. | G09G 3/3677 |
| 2018/0293956 A1* | 10/2018 | Yao | ......................... | G09G 3/20 |

FOREIGN PATENT DOCUMENTS

| | | |
|---|---|---|
| CN | 104795031 A | 7/2015 |
| CN | 105139806 A | 12/2015 |
| CN | 106097951 A | 11/2016 |
| CN | 106935214 A | 7/2017 |
| CN | 107274844 A | 10/2017 |
| JP | 2015011297 A | 1/2015 |
| TW | 201237833 A | 9/2012 |
| TW | 201621865 A | 6/2016 |
| TW | 201735345 A | 10/2017 |

OTHER PUBLICATIONS

Chinese Office Action dated Jun. 9, 2021 issued in corresponding Patent Application No. 201810548016.4 w/English Translation (22 pages).

* cited by examiner

OLED DISPLAY PANEL FOR MINIMIZING AREA OF INTERNALCONNECTION LINE PART FOR CONNECTING GIP DIRVING CIRCUIT LOCATED IN ACTIVE AREA AND OLED DISPLAY DEVICE COMPRISING THE SAME

CROSS-REFERENCE TO RELATED APPLICATION

This application claims the benefit of Korean Patent Application No. 10-2017-0159650, filed on Nov. 27, 2017, which is hereby incorporated by reference in its entirety as if fully set forth herein.

BACKGROUND

Field of the Disclosure

The present disclosure relates to an OLED display panel and an OLED display device comprising the same, the OLED display panel having stages of a GIP driving circuit arranged in a pixel array and signal connection lines for constituting the GIP driving circuit.

Description of the Background

With the development of information society and various portable electronic devices such as mobile communication terminals and notebook computers, demand for flat panel display devices applicable to the electronic devices has increased.

A liquid crystal display (LCD) and an organic light-emitting diode (OLED) display device using an OLED are used as such flat panel display devices.

Such a flat panel display device is composed of a display panel including a plurality of gate lines and a plurality of data lines in order to display images, and a driving circuit for driving the display panel.

Among the aforementioned display devices, a display panel of the LCD includes a thin film transistor array substrate having a thin film transistor array formed on a glass substrate, a color filter array substrate having a color filter array formed on a glass substrate, and a liquid crystal layer interposed between the thin film transistor array substrate and the color filter array substrate.

The thin film transistor array substrate includes a plurality of gate lines GL extended in a first direction and a plurality of data lines DL extended in a second direction perpendicular to the first direction, and a sub-pixel region (pixel: P) is defined by each gate line and each data line. A thin film transistor and a pixel electrode are formed in the sub-pixel region P.

The display panel of the LCD displays an image by applying a voltage to electric field generation electrodes (a pixel electrode and a common electrode) to generate an electric field in the liquid crystal layer and adjusting the arrangement state of liquid crystal molecules of the liquid crystal layer through the electric field to control the polarization of incident light.

In addition, among the aforementioned display devices, a display panel of the OLED display device includes sub-pixels defined at the intersection of a plurality of gate lines and a plurality of data lines, and each sub-pixel includes an OLED composed of an anode, a cathode and an organic emission layer interposed between the anode and the cathode, and a pixel circuit for independently driving the OLED.

The pixel circuit can be configured in various manners and includes at least one switching TFT, a capacitor and a driving TFT.

The at least one switching TFT charges a data voltage in the capacitor in response to a scan pulse. The driving TFT controls the quantity of current supplied to the OLED in response to the data voltage charged in the capacitor to adjust the quantity of emitted light of the OLED.

Such a display panel for display devices is defined by an active area (AA) through which an image is display to a user and a non-active area (NA) that is a peripheral area of the active area AA.

In addition, the driving circuit for driving the display panel includes a gate driving circuit for sequentially supplying gate pulses (or scan pulses) to the plurality of gate lines (scan lines), a data driving circuit for supplying a data voltage to the plurality of data lines, and a timing controller for supplying image data and various control signals to the gate driving circuit and the data driving circuit.

Although the gate driving circuit may be composed of at least one gate drive IC, the gate driving circuit may be simultaneously formed on the non-active area of the display panel in a process of forming the plurality of signal lines (gate lines and data lines) and sub-pixels of the display panel.

That is, a Gate-In-Panel (GIP) method of integrating the gate driving circuit into the display panel is applied.

The aforementioned gate driving circuit includes a larger number of stages than the number of gate lines in order to sequentially supply scan pulses to the gate lines. Each stage is composed of an oxide semiconductor TFT in order to improve driving characteristics.

That is, the gate driving circuit includes a plurality of cascaded stages. In addition, each stage includes an output unit which is connected to each gate line (scan line). Each stage receives a clock signal, a gate start signal, a gate high voltage and a gate low voltage from the timing controller and generates a carry pulse and a scan pulse.

FIG. 1 is a block diagram showing driving circuits of the conventional OLED display device and a relationship between driving circuits.

Referring to FIG. 1, an OLED display device 100 includes an OLED display panel PNL and driving circuits for applying input image data to a pixel array 110 of the OLED display panel PNL.

The OLED display panel PNL includes a plurality of gate lines 149 and a plurality of data lines 139 arranged in an intersecting manner, and the pixel array 110 in which sub-pixels defined by the plurality of gate lines 149 and the plurality of data lines 139 are arranged in a matrix form.

Each sub-pixel includes an OLED composed of an anode, a cathode and an organic emission layer interposed between the anode and the cathode, and a pixel circuit for independently driving the OLED.

The pixel circuit may be configured in various manners and includes at least one switching TFT, a capacitor and a driving TFT.

The driving circuits for driving the OLED display panel PNL include a data driving circuit 130 which is formed in a non-active area and supplies a data voltage to the plurality of data lines 139, a GIP driving circuit 140 which is formed in the non-active area and sequentially supplies a gate (scan) signal synchronized with the data voltage to the plurality of gate lines 149, and a timing controller (TCON) 120.

The timing controller 120 is disposed on a printed circuit board (PCB), aligns input image data received from an external host system and supplies the aligned input image data to the data driving circuit 130. In addition, the timing controller 120 receives timing signals, such as a vertical synchronization signal, a horizontal synchronization signal, a data enable signal and a dot clock signal, synchronized with the input image, from the external host system and generates control signals (a data driver control signal DDC and a gate driver control signal GDC) for controlling operation timing of the data driving circuit 130 and the GIP driving circuit 140.

The data driving circuit 130 receives the input image data and the data driver control signal DDC from the timing controller 120 and converts the input image data into a gamma compensated voltage to generate a data voltage and outputs the data voltage to the plurality of data lines 139.

The data driving circuit 130 includes a plurality of source drive integrated circuits (ICs), each of which is configured in the form of a chip on film (COF) and each of which is connected between a pad part of the printed circuit board on which the timing controller 120 is mounted and a pad part of the display panel PNL.

The GIP driving circuit 140 may be disposed at one edge or both edges of the display panel PNL depending on driving method. The gate driving circuit 140 shown in FIG. 1 is an interlaced GIP driving circuit and includes a first GIP driving circuit 140L disposed on the left side of the display panel PNL and a second GIP driving circuit 140R disposed on the right side of the display panel PNL.

While the GIP driving circuit 140 may be composed of at least one gate drive IC, the GIP driving circuit 140 may be simultaneously formed with the plurality of signal lines (gate lines and data lines) and sub-pixels which constitute the pixel array 110 of the OLED display panel PNL in the non-active area of the display panel through a process of forming the signal lines and sub-pixels.

That is, the Gate-In-Panel (GIP) method of integrating the gate driving circuit into the display panel is applied.

The GIP driving circuit 140 sequentially supplies a gate (scan) signal to the gate lines 149 in response to the control signal GDC transmitted from the timing controller 120.

The aforementioned GIP driving circuit 140 includes a larger number of stages ("GIP" hereinafter) than the number of gate lines in order to sequentially supply a scan pulse to the gate lines and uses oxide semiconductor thin film transistors in order to improve driving characteristics.

That is, the GIP driving circuit 140 includes a plurality of cascaded stages GIP. In addition, each stage GIP includes an output unit which is connected to each gate line. Each stage GIP receives a clock signal, a gate start signal, a gate high voltage and a gate low voltage supplied from the timing controller and generates a carry pulse and a scan pulse.

FIG. 2 is a block diagram of a normal n-th stage GIP.

As shown in FIG. 2, each stage GIP includes a node controller 100 which is set by a start pulse or a carry pulse SET output from the previous stage GIP and reset by a carry pulse RST output from the next stage GIP to control voltages of first and second nodes Q and Qb, and an output unit 200 which receives one of a plurality of clock signals SCCLKs for scan pulse output and one of a plurality of clock signals CRCLKs for carry pulse output and outputs a scan pulse So(n) and a carry pulse Co(n) in response to voltage levels of the first and second nodes Q and Qb.

In the case of a stage GIP driven by a 6-phase clock signal, the node controller 100 is set by a carry pulse Co(n−3) output from the third previous stage GIP and is reset by a carry pulse Co(n+3) output from the third next stage GIP to control the voltages of the first and second nodes Q and Qb.

Although not shown in the figure, the output unit 200 of the stage GIP includes a carry pulse output unit and a scan pulse output unit.

The carry pulse output unit includes a first pull-up transistor and a first pull-down transistor which are serially connected between a carry pulse output clock signal terminal to which one of the plurality of clock signals for carry pulse output is applied and a first gate low voltage terminal VGL1.

The first pull-up transistor is turned on/off in response to the voltage level of the first node Q and the first pull-down transistor is turned on/off in response to the voltage level of the second node Qb to output the input carry pulse output clock signal as a carry pulse Co(n).

The scan pulse output unit includes a second pull-up transistor and a second pull-down transistor which are serially connected between a scan pulse output clock signal terminal to which one of the plurality of clock signals for scan pulse output is applied and a second gate low voltage terminal VGL2, and a bootstrap capacitor connected between the gate electrode and the source electrode of the second pull-up transistor.

The second pull-up transistor is turned on/off in response to the voltage level of the first node Q and the second pull-down transistor is turned on/off in response to the voltage level of the second node Qb to output the input scan pulse output clock signal as a scan pulse So(n).

FIG. 3 is a waveform diagram showing the operation of the n-th stage GIP shown in FIG. 2.

FIG. 3 shows that the node controller 100 is set by the carry pulse Co(n−3) output from the third previous stage GIP and reset by the carry pulse Co(n+3) output from the third next stage GIP to control the voltages of the first and second nodes Q and Qb.

The n-th stage GIP(n) is set by the carry pulse Co(n−3) output from the third previous stage GIP to charge the first node Q with a gate high voltage VGH and to discharge the second node Qb to a gate low voltage VGL. Accordingly, the first pull-up transistor of the carry pulse output unit and the second pull-up transistor of the scan pulse output unit are turned on and the first pull-down transistor of the carry pulse output unit and the second pull-down transistor of the scan pulse output unit are turned off.

In addition, clock signals CRCLK and SCCLK having the same phase are applied to the drain electrode of the first pull-up transistor of the carry pulse output unit and the drain electrode of the second pull-up transistor of the scan pulse output unit.

When the clock signals CRCLK and SCCLK corresponding to a high level are applied to the drain electrode of the first pull-up transistor and the drain electrode of the second pull-up transistor, the voltage of the floated first node Q is bootstrapped by the bootstrap capacitor to increase by 2 VGH.

In a state in which the first node Q is bootstrapped in this manner, the carry pulse output unit and the scan pulse output unit respectively output the input clock signals CRCLK and SCCLK as a carry pulse Co(n) and a scan pulse So(n).

In addition, the stage is reset by the carry pulse Co(n+3) output from the third next stage GIP and thus the first node Q becomes a low state and the second node Qb becomes a high state. Accordingly, the first pull-up transistor of the carry pulse output unit and the second pull-up transistor of the scan pulse output unit are turned off and the first pull-down transistor of the carry pulse output unit and the second pull-down transistor of the scan pulse output unit are turned on to output the gate low voltage VGL as the carry pulse Co(n) and the scan pulse So(n).

However, the GIP driving circuit is integrated in the non-active area of the display panel in the conventional OLED display panel, as described above, and thus it is difficult to design a display device with a narrow bezel.

SUMMARY

Accordingly, the present disclosure devised to solve the aforementioned problem is to provide an OLED display panel and an OLED display device for disposing the signal connection lines for a GIP driving circuit in an active area and for minimizing the number of the signal connection lines in order to minimize the size of a bezel.

An OLED display panel according to the present disclosure to accomplish the object includes: an active area including data lines, scan lines intersecting the data lines, and sub-pixels arranged at each intersection; and a stage of a GIP driving circuit distributed and arranged in a plurality of unit pixel regions driven by m (m being a natural number) scan lines in the active area, to supply scan pulses to the corresponding scan lines, wherein the active area further includes m GIP internal connection lines parts respectively adjacent to the m scan lines, and a plurality of internal connection lines for connecting elements constituting each stage may be distributed and arranged in the m GIP internal connection line parts.

Here, each stage includes: a logic unit for controlling voltage levels of a first node and a second node using a carry pulse of the previous stage and a carry pulse of the next stage; a carry pulse output unit for outputting an input carry pulse output clock signal as a carry pulse in response to the voltage levels of the first node and the second node; and m scan pulse output units for respectively outputting input scan pulse output clock signals to the m scan lines as scan pulses in response to the voltage levels of the first node and the second node.

An OLED display device according to the present disclosure to accomplish the object includes an OLED display panel, which includes: an active area including data lines, scan lines intersecting the data lines, and sub-pixels arranged at each intersection; and a stage of a GIP driving circuit distributed and arranged in a plurality of unit pixel regions driven by m (m being a natural number) scan lines in the active area, to supply scan pulses to the corresponding scan lines, wherein the active area further includes m GIP internal connection lines parts respectively adjacent to the m scan lines, and a plurality of internal connection lines for connecting elements constituting each stage may be distributed and arranged in the m GIP internal connection line parts.

Each of the unit pixel regions may include at least three sub-pixels, a GIP part in which one element constituting each stage of the GIP driving circuit is arranged, and the plurality of internal connection lines arranged in the m GIP internal connection line parts may be extended to the GIP part and electrically connected to the elements constituting each stage.

The OLED display panel having the aforementioned characteristics according to the present disclosure has the following advantages.

That is, an OLED display panel according to a first aspect of the present disclosure can arrange the internal connection lines in the GIP internal connection line parts in the active area.

Moreover, an OLED display panel according to a second aspect of the present disclosure can reduce the number of internal connection lines arranged in GIP internal connection line parts because an output buffer includes a plurality of scan pulse output units, GIP elements are distributed and arranged in unit pixels driven by as many scan lines as the number of scan pulse output units, and internal connection lines (the node Q, the node Qb, the node Qh, connection lines connected to the carry pulse output terminal of the previous stage and the carry pulse output terminal of the next stage) are distributed and arranged in GIP internal connection line parts adjacent to the scan lines.

Accordingly, the size of a bezel of the OLED display panel according to the first aspect of the present disclosure can be reduced.

Accordingly, the aperture ratio of the OLED display panel according to the second aspect of the present disclosure can increase and the area occupied by the GIP internal connection line parts can be reduced, and thus a high-definition display panel can be provided.

DETAILED DESCRIPTION

The applicant applied the technology of distributing and arranging GIP driving circuits in an active area of a display panel in order to minimize the size of a bezel of the display panel (Korean Patent Application No. 10-2017-0125355 (Filing date: Oct. 27, 2017)).

The disclosure of Korean Patent Application (10-2017-0125355) will be briefly described as follows.

Figure 1:
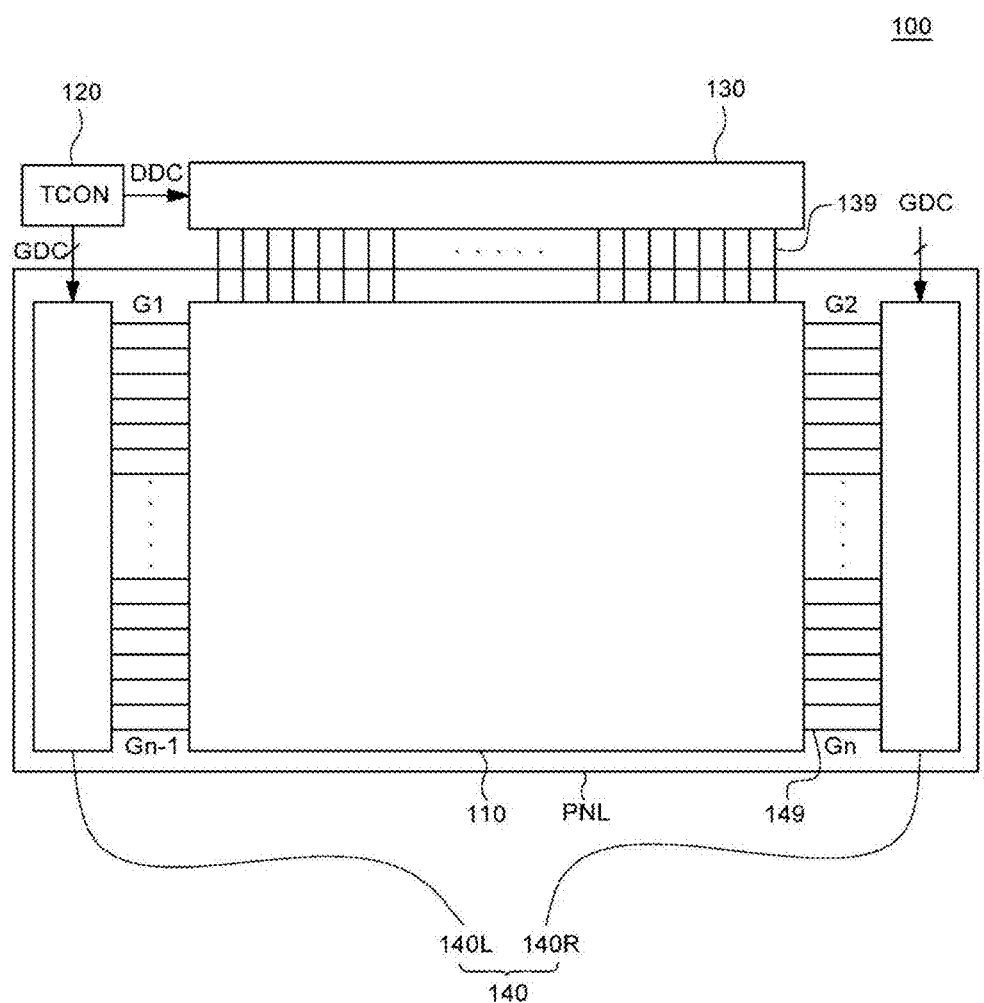
FIG. 1 is a block diagram showing driving circuits of the conventional OLED display device and a relationship between driving circuits.
Figure 2:
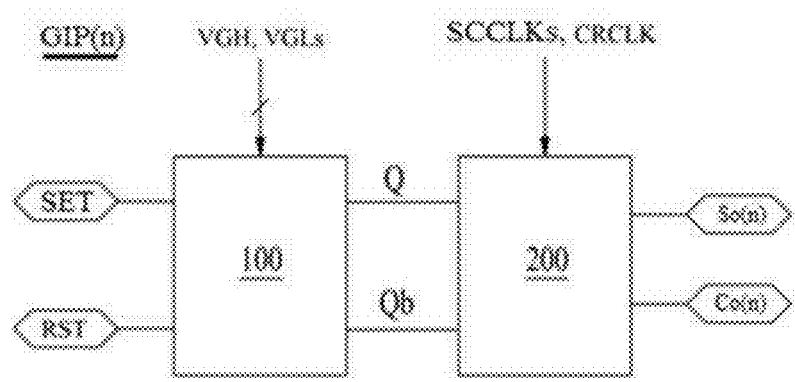
FIG. 2 is a block diagram of a normal n-th stage GIP.
Figure 3:
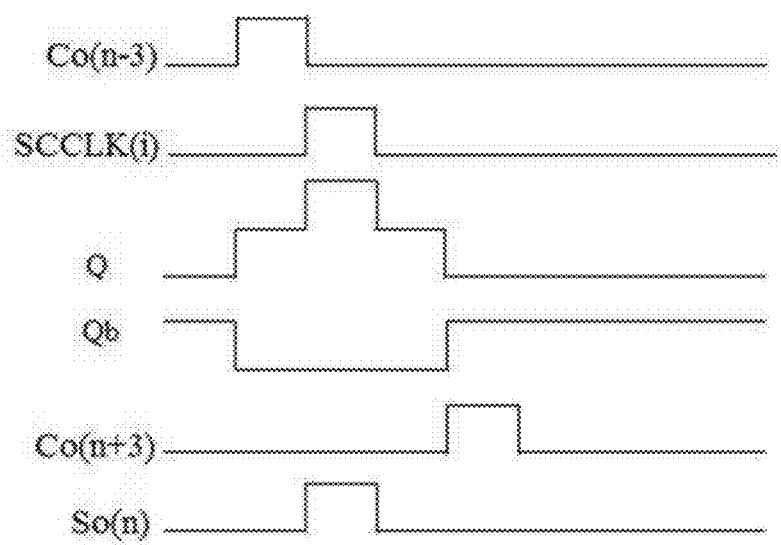
FIG. 3 is a waveform diagram showing the operation of the n-th stage GIP shown in FIG. 2.
Figure 4:
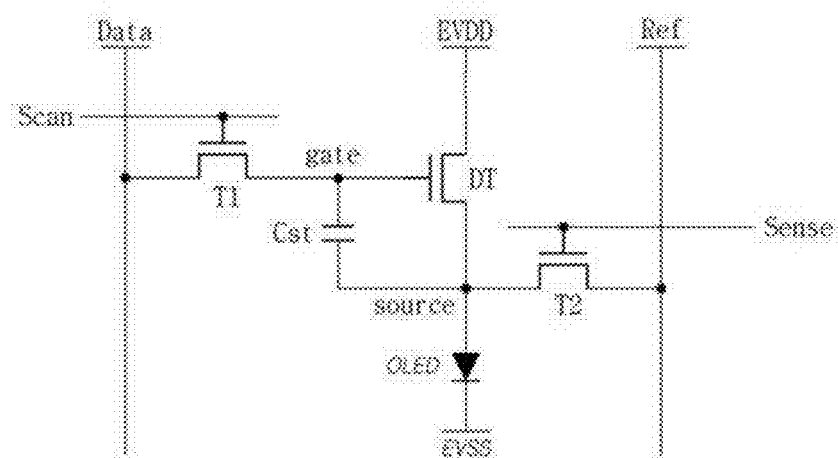
FIG. 4 is a circuit diagram of a sub-pixel in an OLED display panel according to an aspect of the present disclosure.
Figure 5:
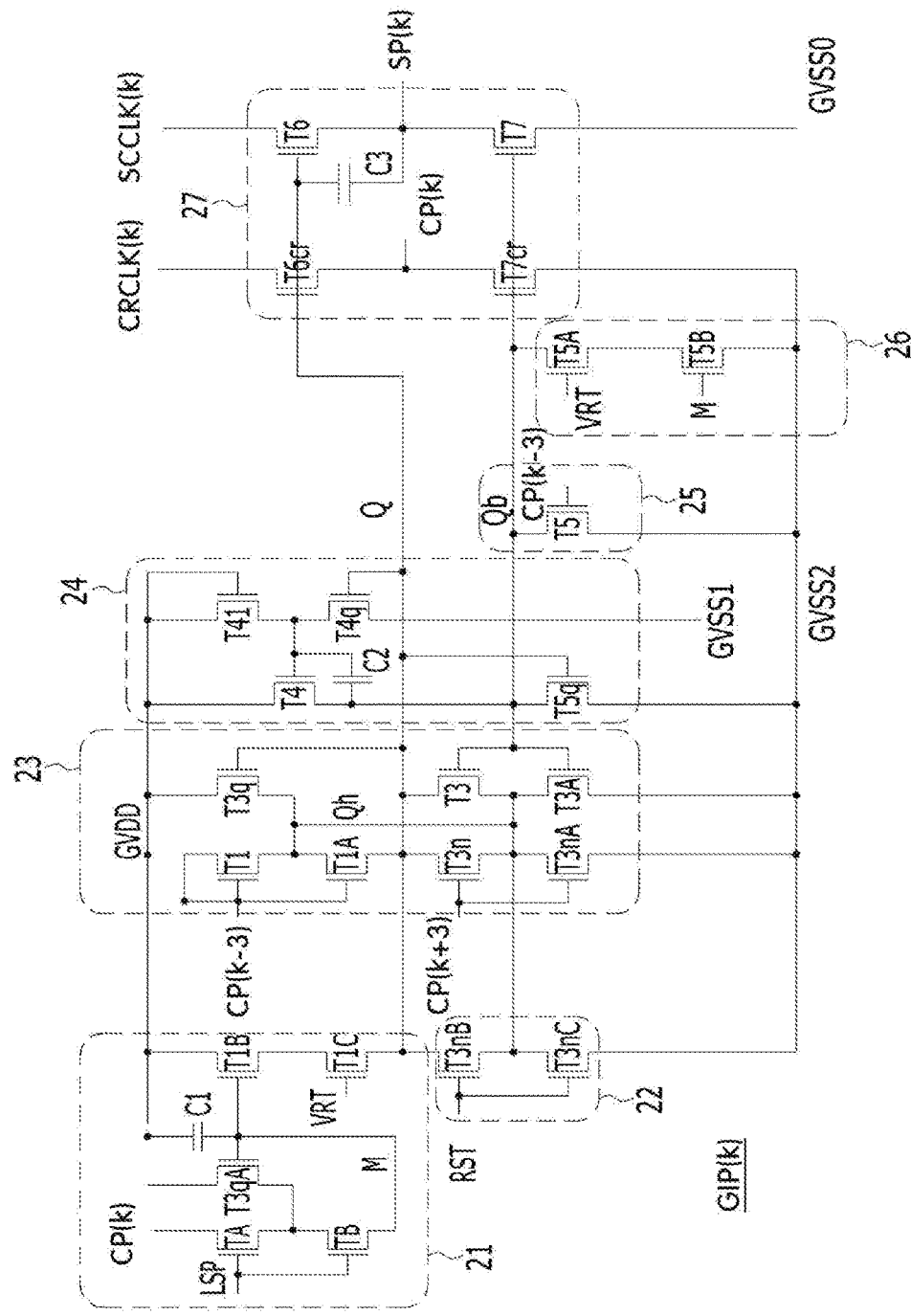
FIG. 5 is a circuit diagram of a k-th stage of a GIP driving circuit according to an aspect of the present disclosure.

FIG. 4 is a circuit diagram of a sub-pixel in an OLED display panel according to the present disclosure and FIG. 5 is a circuit diagram of a k-th stage of a GIP driving circuit according to an aspect of the present disclosure.

That is, FIG. 4 corresponds to FIG. 4 of the Korean Patent Application (10-2017-0125355) and FIG. 5 corresponds to FIG. 5 of the Korean Patent Application (10-2017-0125355).

As shown in FIG. 4, each sub-pixel of the OLED display panel according to an aspect of the present disclosure includes an OLED and a pixel circuit for driving the OLED.

The pixel circuit includes first and second switching TFTs T1 and T2, a storage capacitor Cst and a driving TFT DT.

The first switching TFT T1 charges a data voltage DATA in the storage capacitor Cst in response to a scan pulse signal. The driving TFT DT controls the quantity of current supplied to the OLED according to the data voltage charged in the storage capacitor Cst to adjust the quantity of emitted light of the OLED. The second switching TFT T2 senses the threshold voltage and mobility of the driving TFT DT in response to a sense signal.

The OLED may be composed of a first electrode (e.g., anode or cathode), an organic emission layer and a second electrode (e.g., cathode or anode).

The storage capacitor Cst is electrically connected between the gate and the source of the driving TFT DT to maintain a data voltage corresponding to an image signal voltage or a voltage corresponding thereto for one frame period.

Although FIG. 4 shows a 3T1C sub-pixel configuration composed of three TFTs T1, T2 and DT and one storage capacitor Cst, the present disclosure is not limited thereto and each sub-pixel of the OLED display panel according to the present disclosure may have a 4T1C, 4T2C, 5T1C or 5T2C sub-pixel configuration.

Meanwhile, as shown in FIG. 5, the circuit of the k-th stage of the GIP driving circuit according to an aspect of the present disclosure includes: blank time first and second node controllers 21 and 26, which include transistors TA, TB, T3qA, T1B, T1C, T5A and T5B and a capacitor C1, selectively store a set signal CP(k) according to a line select pulse (LSP), charge a first node Q of the corresponding stage with a first constant voltage GVDD and discharge a second node Qb to a second constant voltage GVSS2 according to a vertical real-time (VRT) signal in a blank time; driving time first to third node controllers 23 and 25, which include transistors T1, T1A, T3n, T3nA, T3q, T3, T3A and T5, charge the first node Q of the corresponding stage with the voltage of a carry pulse CP(k−3) of the third previous stage according to the carry pulse CP(k−3), discharge the first node Q and a third node Qh to a second constant voltage GVSS2 according to a carry pulse CP(k+3) of the third next stage, and charge the third node Qh with the first constant voltage GVDD according to the voltage of the first node in a driving time; an inverter 24, which includes transistors T4, T4l, T4q and T5q and a capacitor C2, inverts the voltage of the first node Q and applies the inverted voltage to the second node Qb; an output buffer 27, which includes pull-up transistors T6cr and T6, pull-down transistors T7cr and T7 and a bootstrapping capacitor C3, receives one clock signal CRCLK(k) among a plurality of clock signals for carry pulse output and one clock signal SCCLK(k) among a plurality of clock signals for scan pulse output, and outputs a carry pulse CP(k) and a scan pulse SP(k) according to the voltages of the first node Q and the second node Qb; and a reset unit 22 which includes transistors T3nB and T3nC and discharges the first node Q to the second constant voltage GVSS2 according to a reset signal RST output from the timing controller in the blank time.

The transistors TB, TA and T3q in the blank time first and second node controllers 21 and 26 are turned on to store the set signal CP(k) in the capacitor C1 when the LSP is at a high level.

In addition, the transistors T1C and T5B are turned on to charge the first node Q with the first constant voltage GVDD and to discharge the second node Qb to the second constant voltage GVSS2 when the VRT signal is at a high level in the blank time.

The transistors T1, T1A and T5 in the driving time first to third node controllers 23 and 25 are turned on to charge the first node Q with the carry pulse CP(k−3) of the third previous stage and to discharge the second node Qb to the second constant voltage GVSS2 when the carry pulse CP(k−3) of the third previous stage is at a high level in the driving time. When the first node Q is charged and the second node Qb is discharged in this manner, the transistor T3q is turned on to charge the third node Qh with the first constant voltage GVDD.

When the carry pulse CP(k+3) of the third next stage is at a high level, the transistors T3n and T3nA are turned on to discharge the first node Q and the third node Qh to the second constant voltage GVSS2.

The inverter 24 inverts the voltage of the first node Q and applies the inverted voltage to the second node Qb.

In the output buffer 27, the pull-up transistor T6cr is turned on and the pull-down transistor T7cr is turned off to output one clock signal CRCLK(k) among the plurality of clock signals for carry pulse output as a carry pulse CP(k) when the first node Q is at a high level and the second node Qb is at a low level. Further, the pull-up transistor T6 is turned on and the pull-down transistor T7 is turned off to output one clock signal SCCLK(k) among the plurality of clock signals for scan pulse output as a scan pulse SP(k) when the first node Q is at a high level and the second node Qb is at a low level.

Here, when the clock signal SCCLK(k) for scan pulse output is applied at a high level, the bootstrapping capacitor C3 of the output buffer 27 bootstraps (couples) the first node Q and thus the first node Q has a higher potential.

In this manner, the output buffer 27 outputs the clock signal CRCLK(k) for carry pulse output and the clock signal SCCLK(k) for scan pulse output, which are input thereto, as a carry pulse CL(k) and a scan pulse SP(k) in a state in which the first node Q is bootstrapped, and thus output loss can be prevented.

In the reset unit 22, the transistors T3nB and T3nC are turned on to discharge the first node Q to the second constant voltage GVSS2 when the reset signal RST output from the timing controller is at a high level in the blank time.

Although FIG. 5 shows a stage of the GIP driving circuit driven with 6 phases, the present disclosure is not limited thereto and stages of the GIP driving circuit can be configured in various manners.

As shown in FIG. 5, each stage of the GIP driving circuit includes 25 transistors and 3 capacitors.

Accordingly, when an element (transistor or capacitor) constituting the stage of the GIP driving circuit is distributed and arranged in a unit pixel region, the circuit of a stage for driving a gate line (scan line) can be arranged.

Figure 6:
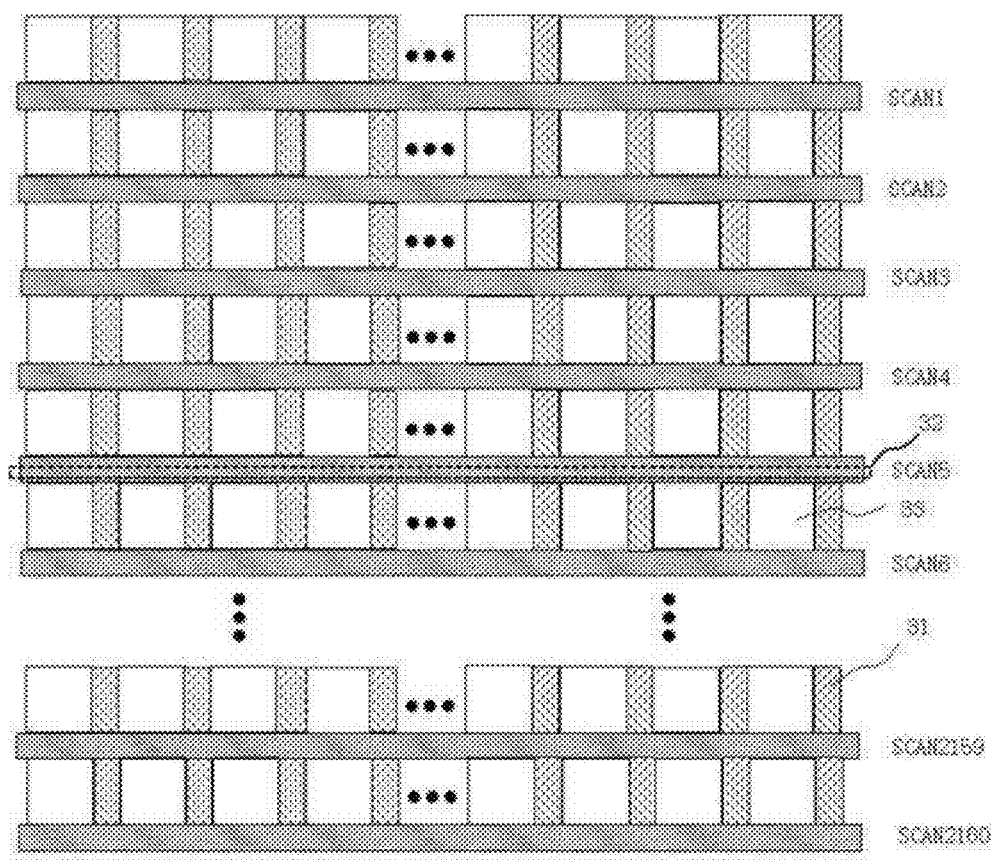
FIG. 6 is a diagram showing a configuration of an active area of an OLED display panel according to a first aspect of the present disclosure.
Figure 7:
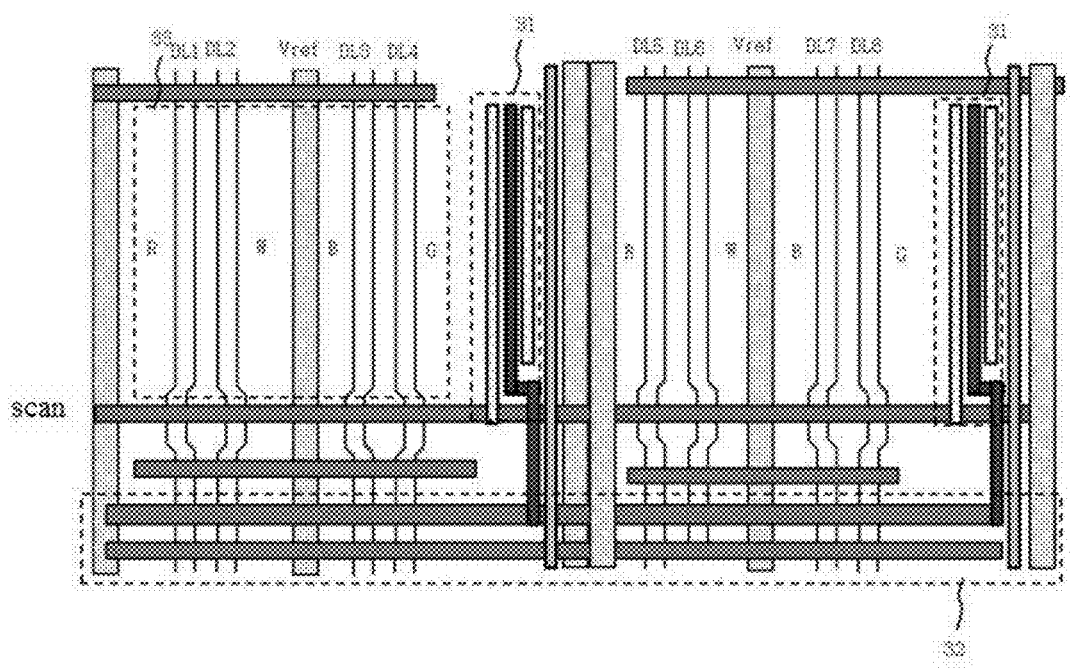
FIG. 7 is a diagram showing a detailed configuration of two neighboring unit pixel regions arranged in the active area of the OLED display panel of FIG. 6.

FIG. 6 is a diagram showing a configuration of the active area of the OLED display panel according to a first aspect of the present disclosure and FIG. 7 is a diagram showing a detailed configuration of two neighboring unit pixels arranged in the active area of the OLED display panel shown in FIG. 6.

That is, FIG. 6 corresponds to FIG. 6 of the Korean Patent Application (10-2017-0125355) and FIG. 7 corresponds to FIG. 7 of the Korean Patent Application (10-2017-0125355).

As shown in FIGS. 6 and 7, in arrangement of the GIP driving circuit in the active area of the OLED display panel, a unit pixel region of the active area is divided into at least three sub-pixels R, G, B and W, a GIP part 31 and a GIP internal interconnection line part 32.

The at least three sub-pixels (R, G, B and W) 33 are configured in such a manner that a plurality of data lines DL1 to DL8, a plurality of reference voltage lines Vref and first and second constant voltage lines EVDD and EVSS are arranged in the vertical direction and a plurality of gate lines (scan lines) SCAN are arranged in the horizontal direction.

The GIP part 31 corresponds to an element (transistor or capacitor) constituting a stage of the GIP driving circuit. That is, the element (transistor or capacitor) constituting the stage of the GIP driving circuit is distributed and arranged in a unit pixel region composed of red, green, blue and white sub-pixels R, G, B and W.

That is, at least one stage ST of the GIP driving circuit for driving a gate line (scan line) is distributed and arranged in a plurality of unit pixel regions driven by a gate line (scan line).

The GIP internal interconnection line part 32 is an area in which connection lines (a node Q, a node QB, a node Qh, a carry pulse output terminal of the previous stage, a carry pulse output terminal of the next stage, etc.) for connecting elements in a stage of the GIP driving circuit are arranged.

As described above, as the GIP driving circuit is arranged in the active area, the plurality of data lines DL1 to DL8 and the reference voltage lines Vref for driving the sub-pixels R, G, B and W are arranged in the vertical direction, as shown in FIG. 7.

In addition, since the GIP part 31 corresponds to an element (transistor or capacitor) constituting a stage of the GIP driving circuit, one of the signals LSP, VRT, GVDD, GVSS0, GVSS1, GVSS2, VST, CRCLK and SCCLK shown in FIG. 5 is applied to the GIP part 31.

Furthermore, in the OLED display panel according to the first aspect of the present disclosure, the circuit of a stage for driving a gate line (scan line) is distributed and arranged in unit pixel regions driven by the gate line (scan line) and thus all connection lines (the node Q, the node Qb, the node Qh, the carry pulse output terminal of the previous stage, the carry pulse output terminal of the next stage, connection lines between elements, etc.) for connecting elements in the stage of the GIP driving circuit need to be arranged in the GIP internal connection line part 32 corresponding to the gate line (scan line).

Figure 8:
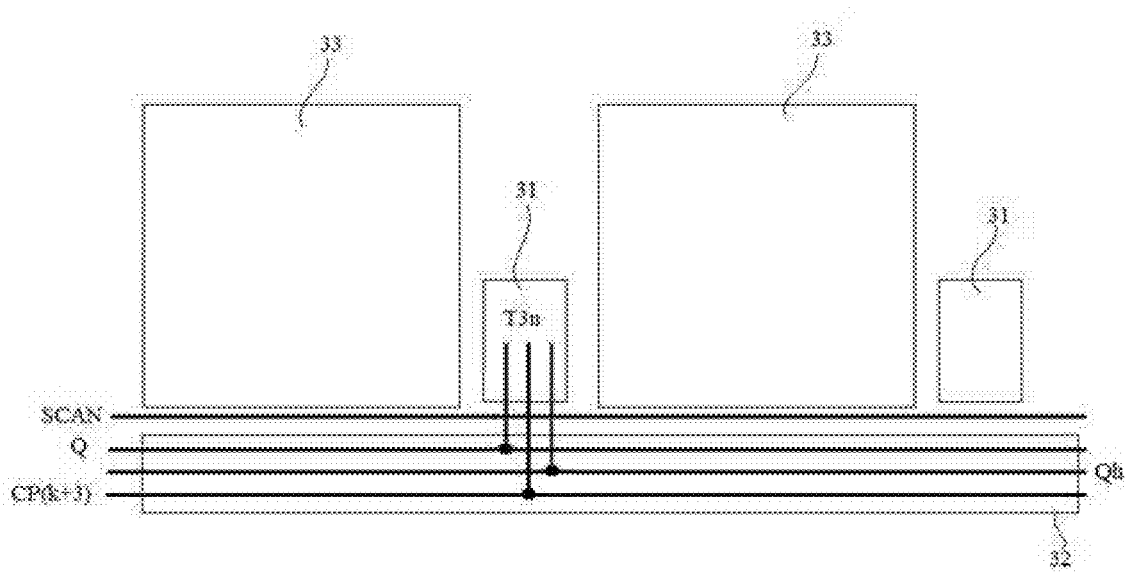
FIG. 8 is a diagram for describing internal connection lines arranged in a GIP internal connection line part according to the first aspect of the present disclosure.

FIG. 8 shows internal connection lines arranged in the GIP internal connection line part 32 according to the first aspect of the present disclosure.

In FIG. 5, a signal line CP(k+3) to which a carry pulse output from the third next stage is applied is connected to the gate electrode of the transistor T3n, the node Q is connected to the source electrode of the transistor T3n, and the node Qh is connected to the drain electrode of the transistor T3n, for example.

Accordingly, when it is assumed that the transistor T3n shown in FIG. 5 is arranged in a GIP part 31, at least the signal line CP(k+3), to which the carry pulse output from the third next stage is applied, the node Q and the node Qb need to be arranged in the GIP internal connection line part 32.

In this manner, the circuit of a stage for driving a gate line (scan line) is distributed and arranged in unit pixel regions driven by the gate line (scan line) in the OLED display panel according to the first aspect of the present disclosure, and thus a maximum of four GIP internal connection lines (the node Q, the node Qb, the node Qh, the carry pulse output terminal of the previous stage, the carry pulse output terminal of the next stage, connection lines between elements, etc.) are arranged in the GIP internal connection line part 32 of each line. For example, a connection line between elements corresponds to a connection line between the gate electrode of the transistor T4 and the drain electrode of the transistor T4l in FIG. 5.

Accordingly, the aperture ratio of the OLED display panel according to the first aspect of the present disclosure decreases and the area occupied by the GIP internal connection line parts 32 increases, and thus the OLED display panel is not suitable for high definition.

To solve this problem, in an OLED display panel and an OLED display device according to a second aspect of the present disclosure, the stages of the GIP driving circuit are arranged in the pixel array to increase the aperture ratio of the OLED display panel while providing a narrow bezel and to reduce the area occupied by the GIP internal connection line parts, realizing high definition.

Figure 9:
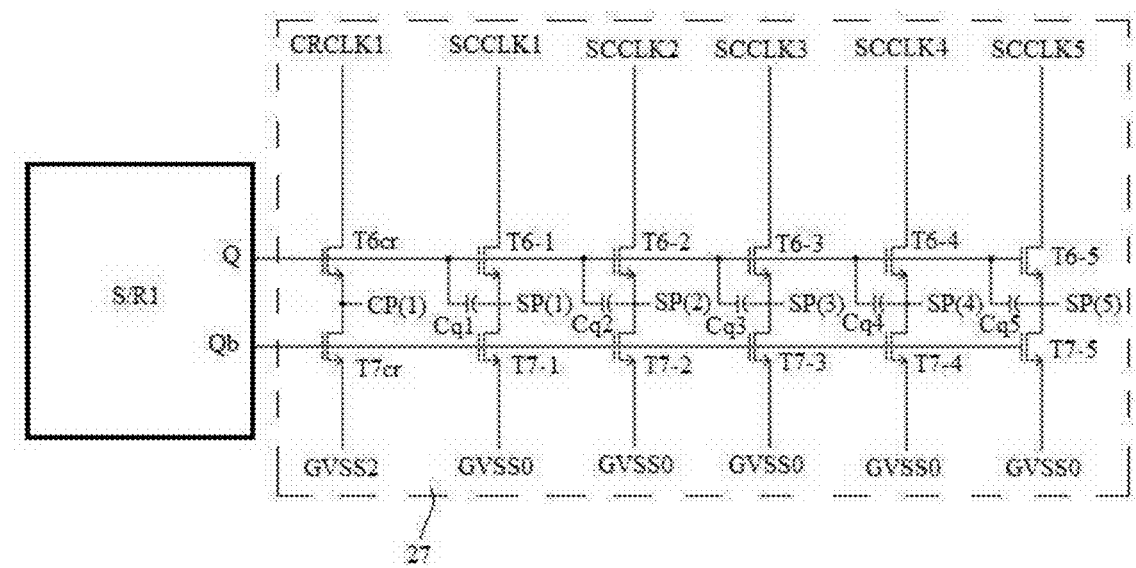
FIG. 9 is a block diagram of an n-th stage GIP according to a second aspect of the present disclosure.

FIG. 9 is a block diagram of the n-th stage GIP according to the second aspect of the present disclosure.

In the OLED display panel according to the second aspect of the present disclosure, the stages of the GIP driving circuit are arranged in the pixel array in such a manner that a stage including a plurality of scan pulse output units is configured for unit pixels driven by a plurality of scan lines.

That is, the circuit of the k-th stage of the GIP driving circuit according to an aspect of the present disclosure includes the blank time first and second node controllers 21 and 26, the driving time first to third node controllers 23 and 25, the inverter 24, the output buffer 27 and the reset unit 22, as described above with reference to FIG. 5.

However, the OLED display panel according to the second aspect of the present disclosure has the stages of the GIP driving circuit, which are arranged in the pixel array, wherein the blank time first and second node controllers 21 and 26, the driving time first to third node controllers 23 and 25, the inverter 24 and the reset unit 22, which are described above with reference to FIG. 5, and the output buffer 27 including a carry pulse output unit and a plurality of scan pulse output units are arranged in unit pixels driven by a plurality of scan lines, as shown in FIG. 9.

In FIG. 9, the blank time first and second node controllers 21 and 26, the driving time first to third node controllers 23 and 25, the inverter 24 and the reset unit 22, which are described above with reference to FIG. 5, are represented by a logic unit S/R1.

The logic unit S/R1 controls the voltage levels of the first node Q and the second node Qb using the line select signal LSP, the set signal CP(k), the vertical real-time signal VRT, the carry pulse CP(k−3) of the m-th previous stage, the carry pulse CP(k+3) of the m-th next stage and the reset signal RST, as described in FIG. 5.

In addition, the output buffer 27 includes a carry pulse output unit and a plurality of scan pulse output units.

That is, the output buffer 27 includes: a carry pulse output unit composed of a pull-up transistor T6cr and a pull-down transistor T7cr, and configured in such a manner that the pull-up transistor T6cr is turned on and the pull-down transistor T7cr is turned off to output a clock signal CRCLK1 among the plurality of carry pulse output clock signals as a carry pulse CP(1) when the first node Q is at a high level and the second node Qb is at a low level; a first scan pulse output unit composed of a first pull-up transistor T6-1, a first pull-down transistor T7-1 and a first bootstrapping capacitor Cq1, and configured in such a manner that the first pull-up transistor T6-1 is turned on and the first pull-down transistor T7-1 is turned off to output a clock signal SCCLK(1) among the plurality of scan pulse output clock signals as a scan pulse SP(1) when the first node Q is at a high level and the second node Qb is at a low level; a second scan pulse output unit composed of a second pull-up transistor T6-2, a second pull-down transistor T7-2 and a second bootstrapping capacitor Cq2, and configured in such a manner that the second pull-up transistor T6-2 is turned on and the second pull-down transistor T7-2 is turned off to output a clock signal SCCLK(2) among the plurality of scan pulse output clock signals as a scan pulse SP(2) when the first node Q is a high level and the second node Qb is a low level; a third scan pulse output unit composed of a third pull-up transistor T6-3, a third pull-down transistor T7-3 and a third bootstrapping capacitor Cq3, and configured in such a manner that the third pull-up transistor T6-3 is turned on and the third pull-down transistor T7-3 is turned off to output a clock signal SCCLK(3) among the plurality of scan pulse output clock signals as a scan pulse SP(3) when the first node Q is at a high level and the second node Qb is at a low level; a fourth scan pulse output unit composed of a fourth pull-up transistor T6-4, a fourth pull-down transistor T7-4 and a fourth bootstrapping capacitor Cq4, and configured in such a manner that the fourth pull-up transistor T6-4 is turned on and the fourth pull-down transistor T7-4 is turned off to output a clock signal SCCLK(4) among the plurality of scan pulse output clock signals as a scan pulse SP(4) when the first node Q is at a high level and the second node Qb is at a low level; and a fifth scan pulse output unit composed of a fifth pull-up transistor T6-5, a fifth pull-down transistor T7-5 and a fifth bootstrapping capacitor Cq5, and configured in such a manner that the fifth pull-up transistor T6-5 is turned on and the fifth pull-down transistor T7-5 is turned off to output a clock signal SCCLK(5) among the plurality of scan pulse output clock signals as a scan pulse SP(5) when the first node Q is at a high level and the second node Qb is at a low level.

When the output buffer 27 includes one carry pulse output unit and five scan pulse output units, as shown in FIG. 9, elements constituting the stage having the logic unit S/R1 and the output buffer 27 shown in FIG. 9 are distributed and arranged in unit pixels driven by five scan lines in the OLED display panel according to the second aspect of the present disclosure.

Although the output buffer 27 includes one carry pulse output unit and five scan pulse output units in FIG. 9, the present disclosure is not limited thereto and the output buffer 27 may include one carry pulse output unit and at least two scan pulse output units.

If the output buffer 27 includes one carry pulse output unit and two scan pulse output units, the elements constituting the stage having the logic unit S/R1 and the output buffer 27 shown in FIG. 9 are distributed and arranged in unit pixels driven by two scan lines in the OLED display panel according to the second aspect of the present disclosure.

Further, when the output buffer 27 includes one carry pulse output unit and three scan pulse output units, the elements constituting the stage having the logic unit S/R1 and the output buffer 27 shown in FIG. 9 are distributed and arranged in unit pixels driven by three scan lines in the OLED display panel according to the second aspect of the present disclosure.

That is, in the OLED display panel according to the second aspect of the present disclosure, the elements constituting the stage having the logic unit S/R1 and the output buffer 27 shown in FIG. 9 are distributed and arranged in unit pixels driven by as many scan lines as the number of scan pulse output units.

Line arrangement of the GIP internal connection line parts when the stage having the aforementioned configuration is arranged in the corresponding area will be described below.

Figure 10:
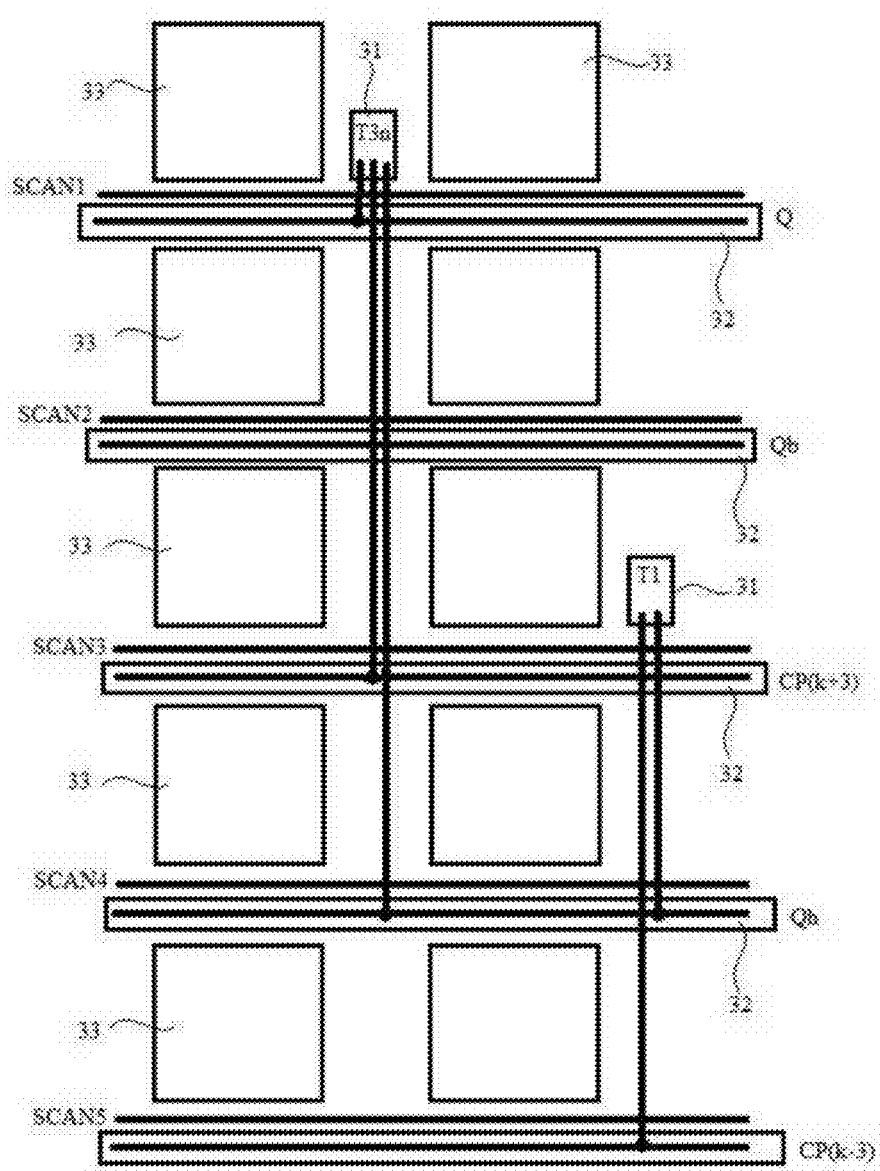
FIG. 10 is a diagram for describing internal connection lines arranged in a GIP internal connection line part according to the second aspect of the present disclosure.

FIG. 10 is a diagram for describing internal connection lines arranged in the GIP internal connection line parts according to the second aspect of the present disclosure.

FIG. 10 illustrates internal connection lines when the output buffer 27 includes one carry pulse output unit and five scan pulse output units as shown in FIG. 9.

That is, the elements constituting the stage having the logic unit S/R1 and the output buffer 27 shown in FIG. 9 are distributed and arranged in arbitrary unit pixels among the unit pixels driven by the first to fifth scan lines SCAN1 to SCAN5.

In addition, one of the internal connection lines (the node Q, the node Qb, the node Qh, the carry pulse output terminal of the previous stage, the carry pulse output terminal of the next stage, connection lines between elements, etc.) is arranged in each GIP internal connection line part 32 adjacent to each scan line SCAN1 to SCAN5.

That is, the node Q is arranged in the GIP internal connection line part 32 adjacent to the first scan line SCAN1, the node Qb is arranged in the GIP internal connection line part 32 adjacent to the second scan line SCAN2, the connection line CP(k+3) connected to the carry pulse output terminal of the next stage is arranged in the GIP internal connection line part 32 adjacent to the third scan line SCAN3, the node Qb is arranged in the GIP internal connection line part 32 adjacent to the fourth scan line SCAN4, and the connection line CP(k−3) connected to the carry pulse output terminal of the previous stage is arranged in the GIP internal connection line part 32 adjacent to the fifth scan line SCAN5.

In addition, the elements constituting the stage having the logic unit S/R1 and the output buffer 27 shown in FIG. 9 are distributed and arranged in arbitrary unit pixels among the unit pixels driven by the first to fifth scan lines SCAN1 to SCAN5, as described above.

For example, the signal line CP(k+3) to which the carry pulse output from the third next stage is applied is connected to the gate electrode of the transistor T3n (refer to FIG. 5) among the elements constituting the stage having the logic unit S/R1 and the output buffer 27 shown in FIG. 9, the node Q is connected to the source electrode of the transistor T3n, and the node Qh is connected to the drain electrode of the transistor T3n.

Accordingly, if the transistor T3n shown in FIG. 5 is arranged in the GIP part 31, the node Q arranged in the GIP internal connection line part 32 adjacent to the first scan line SCAN1, the connection line CP(k+3) connected to the carry pulse output terminal of the next stage, which is arranged in the GIP internal connection line part 32 adjacent to the third scan line SCAN3, and the node Qh arranged in the GIP internal connection line part 32 adjacent to the fourth scan line SCAN4 are connected to the transistor T3n, as shown in FIG. 10.

In addition, the signal line CP(k−3) to which the carry pulse output from the third previous stage is applied is connected to the gate electrode and the source electrode of the transistor T1 (refer to FIG. 5) among the elements constituting the stage having the logic unit S/R1 and the output buffer 27 shown in FIG. 9, and the node Qh is connected to the source electrode of the transistor T1.

Accordingly, if the transistor T1 shown in FIG. 5 is arranged in the GIP part 31, the node Qh arranged in the GIP internal connection line part 32 adjacent to the fourth scan line SCAN4 and the connection line CP(k−3) connected to the carry pulse output terminal of the previous stage, which is arranged in the GIP internal connection line part 32 adjacent to the fifth scan line SCAN53, are connected to the transistor T1, as shown in FIG. 10.

Since the elements constituting the stage having the logic unit S/R1 and the output buffer 27 shown in FIG. 9 are distributed and arranged in arbitrary unit pixels among the unit pixels driven by the first to fifth scan lines SCAN1 to SCAN5, as described above, GIP elements are not arranged in the GIP parts 31 of all unit pixels. Accordingly, signal lines extended to the GIP parts 31 and arranged in the GIP internal connection line parts 32 can be connected to the GIP elements.

Although FIG. 10 illustrates that the unit elements constituting the stage having the logic unit S/R1 and the output buffer 27 shown in FIG. 9 are distributed and arranged in arbitrary unit pixels among the unit pixels driven by the first to fifth scan lines SCAN1 to SCAN5, the present disclosure is not limited thereto and the unit elements constituting the stage may be distributed and arranged in arbitrary unit pixels among unit pixels driven by at least two scan lines.

If the output buffer 27 shown in FIG. 9 includes one carry pulse output unit and two scan pulse output units, the elements constituting the stage having the logic unit S/R1 and the output buffer 27 shown in FIG. 9 are distributed and arranged in unit pixels driven by the first and second scan lines SCAN1 and SCAN2 in the OLED display panel according to the second aspect of the present disclosure. In addition, the internal connection lines (the node Q, the node Qb, the node Qh, the carry pulse output terminal of the previous stage, the carry pulse output terminal of the next stage, connection lines between elements, etc.) are distributed and arranged in two GIP internal connection line parts 32 adjacent to the first and second scan lines SCAN1 and SCAN2.

If the output buffer 27 shown in FIG. 9 includes one carry pulse output unit and three scan pulse output units, the elements constituting the stage having the logic unit S/R1 and the output buffer 27 shown in FIG. 9 are distributed and arranged in unit pixels driven by the first to third scan lines SCAN1 to SCAN3 in the OLED display panel according to the second aspect of the present disclosure. In addition, the internal connection lines (the node Q, the node Qb, the node Qh, the carry pulse output terminal of the previous stage, the carry pulse output terminal of the next stage, connection lines between elements, etc.) are distributed and arranged in three GIP internal connection line parts 32 adjacent to the first to third scan lines SCAN1 to SCAN3.

That is, in the OLED display panel according to the second aspect of the present disclosure, the elements constituting the stage having the logic unit S/R1 and the output buffer 27 shown in FIG. 9 are distributed and arranged in unit pixels driven by as many scan lines as the number of scan pulse output units included in the output buffer 27, and the internal connection lines (the node Q, the node Qb, the node Qh, the carry pulse output terminal of the previous stage, the carry pulse output terminal of the next stage, connection lines between elements, etc.) are distributed and arranged in GIP internal connection line parts 32 adjacent to the corresponding scan lines.

As described above, in the OLED display panel according to the second aspect of the present disclosure, the output buffer illustrated in FIG. 9 includes a plurality of scan pulse output units, GIP elements are distributed and arranged in unit pixels driven by as many scan lines as the number of scan pulse output units, and the internal connection lines (the node Q, the node Qb, the node Qh, the carry pulse output terminal of the previous stage, the carry pulse output terminal of the next stage, connection lines between elements, etc.) are distributed and arranged in GIP internal connection line parts 32 adjacent to the corresponding scan lines, and thus the number of internal connection lines arranged in the GIP internal connection lines parts 32 can be reduced.

Accordingly, the aperture ratio of the OLED display panel according to the second aspect of the present disclosure can increase and the area occupied by the GIP internal connection lines 32 can be reduced, and thus a high-definition display panel can be realized.

Those skilled in the art will appreciate that various modifications and variations can be made in the present disclosure without departing from the spirit or scope of the present disclosure through the above description. Accordingly, the scope of the disclosure should be determined by the appended claims and their legal equivalents, not by the above description.

What is claimed is:

1. An OLED display panel, comprising:
   a plurality of data lines and a plurality of scan lines intersecting the plurality of data lines, and a plurality of sub-pixels arranged at each intersection of the plurality of data lines and the plurality of scan lines at an active area;
   a stage of a gate in panel (GIP) driving circuit including m (m being a natural number of 2 or more) scan pulse output units outputting m scan pulses to m scan lines, wherein a plurality of elements constituting the stage of the GIP driving circuit are arranged in a plurality of unit pixel regions of m horizontal lines driven by the m scan lines in the active area;
   m GIP internal connection line parts respectively adjacent to the m scan lines at the active area; and
   a plurality of internal connection lines connecting the plurality of elements constituting the stage of the GIP driving circuit and the m GIP internal connection line parts,
   wherein each scan line and each GIP internal connection line part are parallel with each other, and
   wherein the number of the m GIP internal connection line parts corresponds to the number of the m scan lines.

2. The OLED display panel according to claim 1, wherein the stage further includes:
   a logic unit controlling voltage levels of a first node and a second node using a carry pulse of a previous stage and a carry pulse of a next stage; and
   a carry pulse output unit outputting an input carry pulse output clock signal as a carry pulse in response to the voltage levels of the first node and the second node.

3. The OLED display panel according to claim 1, wherein at least one of the unit pixel regions includes at least three sub-pixels, a GIP part in which one of the plurality of elements constituting the stage of the GIP driving circuit is arranged, and at least one of the plurality of internal connection lines electrically connected to the one of the plurality of elements and the m GIP internal connection line parts.

4. The OLED display panel according to claim 1, wherein m GIP internal connection line parts include a node Q, a node Qb, a node Qh, a carry pulse output terminal of the previous stage and a carry pulse output terminal of the next stage, in areas respectively adjacent to the m scan lines.

5. The OLED display panel according to claim 1, wherein the m includes one of 2, 3 and 5.

6. The OLED display panel according to claim 1, wherein one of the plurality of elements constituting the stage is located between two adjacent unit pixels and is connected to at least one of the m GIP internal connection line parts through at least one of the plurality of internal connection lines.

7. The OLED display panel according to claim 1, wherein the plurality of internal connection lines are located in a direction perpendicular to the m GIP internal connection line parts between two adjacent unit pixels.

\* \* \* \* \*